United States Patent [19]

Heppinstall

[11] 4,099,133

[45] Jul. 4, 1978

[54] KLYSTRON AMPLIFIERS

[75] Inventor: Roy Heppinstall, Witham, England

[73] Assignee: English Electric Valve Company Limited, United Kingdom

[21] Appl. No.: 764,545

[22] Filed: Feb. 1, 1977

[30] Foreign Application Priority Data

Feb. 5, 1976 [GB] United Kingdom ................. 4644/76

[51] Int. Cl.[2] ................................................ H03F 3/56

[52] U.S. Cl. ..................................... 330/45; 315/5.35; 315/5.39

[58] Field of Search ................ 313/36; 315/5.35, 5.39, 315/5.14, 5.26, 5.27, 5.51; 330/45

[56] References Cited

U.S. PATENT DOCUMENTS

| | | | |
|---|---|---|---|
| 2,305,884 | 12/1942 | Litton | 315/5.35 |
| 3,069,590 | 12/1962 | Walter et al. | 313/36 X |
| 3,153,743 | 10/1964 | Meyerer | 315/5.35 X |
| 3,297,907 | 1/1967 | LaRue et al. | 315/5.35 X |
| 3,322,997 | 5/1967 | Caryotakis | 315/5.35 |

*Primary Examiner*—Lawrence J. Dahl

[57] ABSTRACT

This invention provides a klystron amplifier arrangement having means for producing a radial component of magnetic field tending to direct beam electrons out of their path from the electron gun to the collector electrode of the kylstron. By suitably choosing the strength of the radial component of magnetic field generated undesired slow electrons in the beam will tend to be deflected, while the relatively fast electrons will be substantially unaffected.

The radial component of magnetic field may be axially asymmetrical or symmetrical and may be generated in a variety of ways, for example, by means of magnetic material introduced into the field region of the normally provided main solenoid or by the use of an auxiliary winding. The magnetic material may form at least part of a cylinder or cylinders surrounding the beam path, for example, if provided as at least part of a drift tube or a water jacket. Any auxiliary solenoid may for example, be wound around a cooling jacket surrounding the beam path.

22 Claims, 4 Drawing Figures

KLYSTRON AMPLIFIERS

Figure 1:
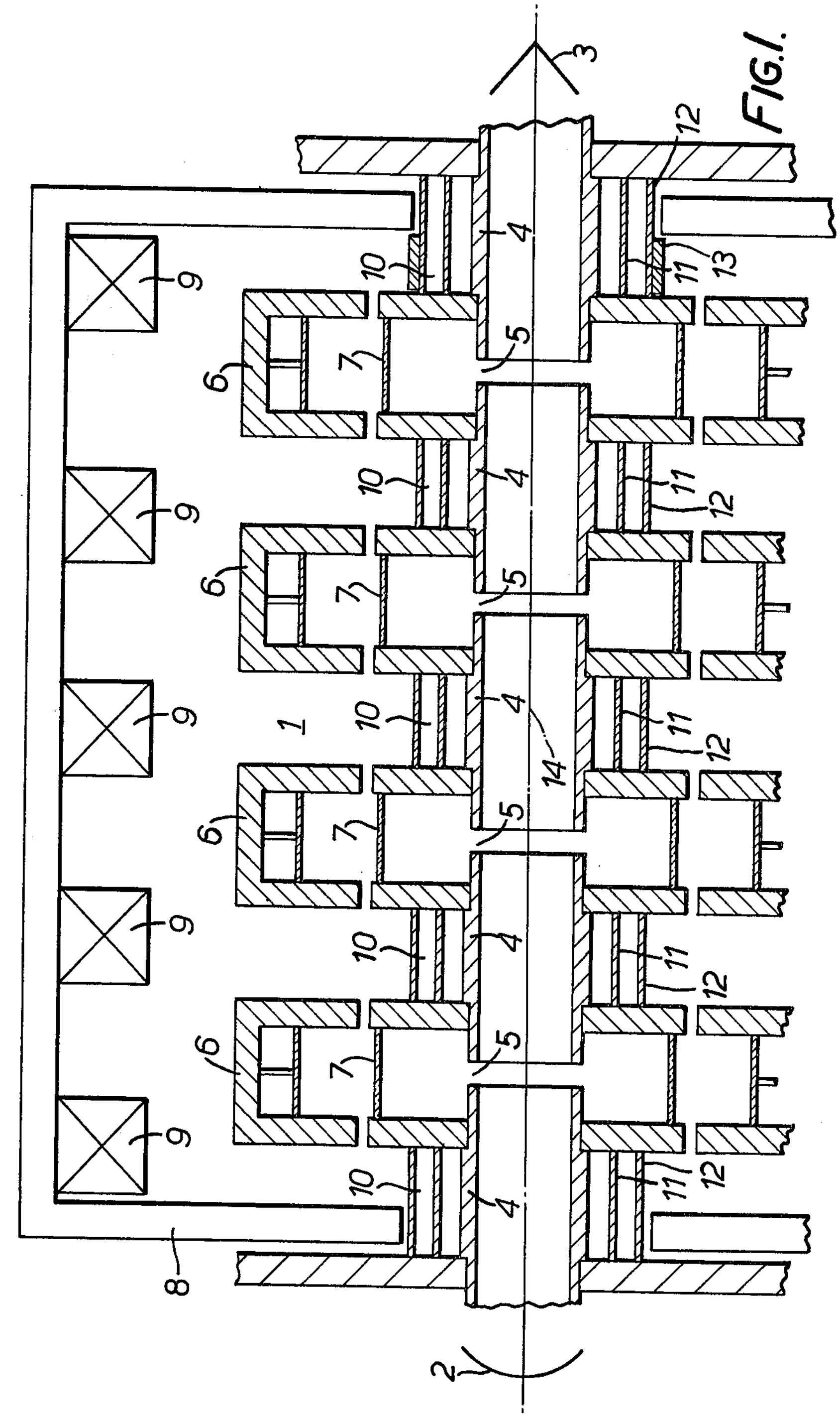

This invention relates to klystron amplifiers.

As is well known, a klystron amplifier consists principally of an electron gun, an r.f. interaction structure and a collector. The r.f. interaction structure consists of a series of drift tubes, through which the electron beam from the gun passes on its way to the collector, which drift tubes are separated by interaction gaps. Klystrons may either be of the external cavity type, in which separate cavities are fitted externally to the vacuum envelope to surround the interaction gaps, or of the integral cavity type, in which the cavities form integral parts of the vacuum envelope. The present invention relates to both of these types.

In the operation of a klystron amplifier an r.f. voltage is generated across the input gap adjacent the electron gun. This r.f. voltage velocity-modulates beam electrons from the gun passing through the input gap. The amount of modulation depends upon the amplitude of the r.f. voltage across the input gap. Electrons then drift down the first drift tube until the second gap is reached, at which further velocity modulation takes place. This process is repeated until the final gap is reached, where the r.f. energy is coupled from the beam and out of the klystron tube.

The process of modulation results in the electrons in the beam acquiring a spread of velocities. Inevitably some electrons acquire slow velocities and indeed in some cases some slow electrons may have the directions of their velocities reversed in the output gap and tend to return towards the electron gun. Other slow electrons may be reflected from the collector and tend to return towards the electron gun.

Electrons with very slow velocities (forward or reversed) can have a deleterious effect on the quality of the output of the klystron amplifier. The effect is particularly troublesome where a high quality performance is required, as for television transmission.

The present invention seeks to provide an improved klystron amplifier tube in which some, at least, of such very slow electrons are eliminated.

According to this invention, a klystron amplifier arrangement is provided with means for producing a radial component of magnetic field tending to direct beam electrons out of their path from the electron gun to the collector electrode.

By suitably choosing the strength of the radial component of magnetic field generated, this will tend to cause very slow electrons in the beam to be deflected such that these are collected by the interaction structure (for example by the drift tubes), whilst at the same time having little or no effect on the relatively fast electrons in the beam.

Said means may be such as to provide a radial component of magnetic field which is axially symmetrical. If the radial component of magnetic field is axially symmetrical, this will have a greater effect upon slow moving electrons in the outer regions of the beam, but will have a decreasing effect towards the central axis of the beam and in some cases it may be preferred to provide said means such that said radial component of magnetic field is axially asymmetrical.

Preferably in cases where the klystron amplifier is provided in operation with a focusing magnetic field produced by one or more solenoids, said means comprises means for perturbing the magnetic field produced by said solenoid or solenoids to produce said radial component of magnetic field. In this last mentioned case said means may comprise an axially symmetrical or asymmetrical quantity of magnetic material introduced into the field region of said solenoid. Commonly said magnetic material will form at least part of a cylinder or cylinders surrounding the path of said beam. Said magnetic material may be provided as part of, or the whole of, one or more of the drift tubes of the interaction structure or one or more of the cavities of the klystron or one or more of any water jackets provided for the purpose of cooling said drift tubes, or any combination thereof. Wherever said magnetic material is in contact with cooling water during operation, preferably said material is treated so as to be corrosion resistant, e.g., by copper plating.

Said magnetic material may also be incorporated within said solenoid.

Said means may also comprise an auxiliary solenoid which may be within or attached to said main solenoid or wound around or formed as part of said klystron amplifier. Where said means is such as to produce a radial component of magnetic field which is axially asymmetrical, said auxiliary solenoid is arranged so that its axis is not co-incident with that of said main solenoid. In this last mentioned case, preferably said auxiliary solenoid is affixed to the side of the klystron amplifier with its axis at right angles to the axis of said electron beam. Said auxiliary solenoid may be electrically isolated from said main solenoid and provided with its own means for applying power thereto or the auxiliary solenoid may be arranged to be supplied in series with said main solenoid.

Said means may also comprise a small number of turns of the main solenoid which are contra-wound.

The invention is illustrated in and further described with reference to the accompanying drawings in which FIGS. 1 to 4 are cross sections illustrating four different embodiments of klystron amplifier in accordance with the present invention.

In all Figures like references are used to denote like parts.

Referring to FIG. 1, the interaction structure 1 of the klystron amplifier tube is shown in detail, whereas the cathode 2 and collector electrode 3 are schematically represented. The interaction structure 1 consists of a number of drift tubes 4 separated by interaction gaps 5. Each interaction gap 5 is surrounded by a cavity 6. In this example the klystron is of the external cavity type, the vacuum envelope of the tube being completed not by the walls of the cavity 6 but by ceramic windows 7 through which the cavities 6 are coupled to the interaction gaps 5.

Surrounding the interaction structure 1 is a solenoid frame 8 carrying a number of solenoids 9 providing, as known per se a magnetic focusing field for the beam travelling from the cathode gun 2 through the drift tubes 4 to the collector electrode 3.

In order to provide for cooling of the drift tubes 4, water passages 10 are provided. The passages are formed by an inner cylindrical jacket member 11 and an outer cylindrical water jacket member 12.

As so far described the klystron amplifier tube is as known per se. As has already been described the process of modulation as the electron beam travels through the drift tubes 4 results in the electrons in the beam acquiring a spread of velocities and slow electrons, some of which may be travelling in the reverse direction due either to having their velocities reversed in the output gap or due to reflection by the collector electrode 3 tend to have a deleterious effect on the quality of the output of the tube. In order to remove at least some such slow electrons, a radial component of magnetic field is created which will tend to deflect electrons out of their path from the cathode gun 2 to the collector electrode 3 so that these tend to be collected by the interaction structure itself (for example, by the drift tubes 4). In order to create this field in the example shown in FIG. 1, a cylindrical sleeve 13 of iron is provided to surround the outer jacket 12 of the last of the water coolant passages 10, i.e., the water passage 10 adjacent the collector electrode 3.

If, as illustrated, the iron sleeve 13 is symmetrical about the axis 14 of the tube the radial component of magnetic field it produces by perturbing the magnetic field produced by the solenoids 9 would itself be symmetrical.

Whilst only the last of the water passages 10 are shown surrounded by an iron sleeve 13, if desired sleeves corresponding to sleeve 13 may be provided in respect of preceding water passages also. In general, however, since the numbers of slow electrons will tend to increase towards the collector electrode 3, the sleeves such as 13 will be fitted around water passages towards the collector electrode end of the interaction structure 1 rather than towards the cathode gun end of the interaction structure 1.

In one modification one or other or both of the inner and outer cylindrical jackets 11 and 12 of at least one of the water passages 10 is provided itself to be of iron. In such a case, however, any iron surface which would be in contact with water within the passages 10 is treated so as to resist corrosion, e.g., copper plated.

Figure 2:
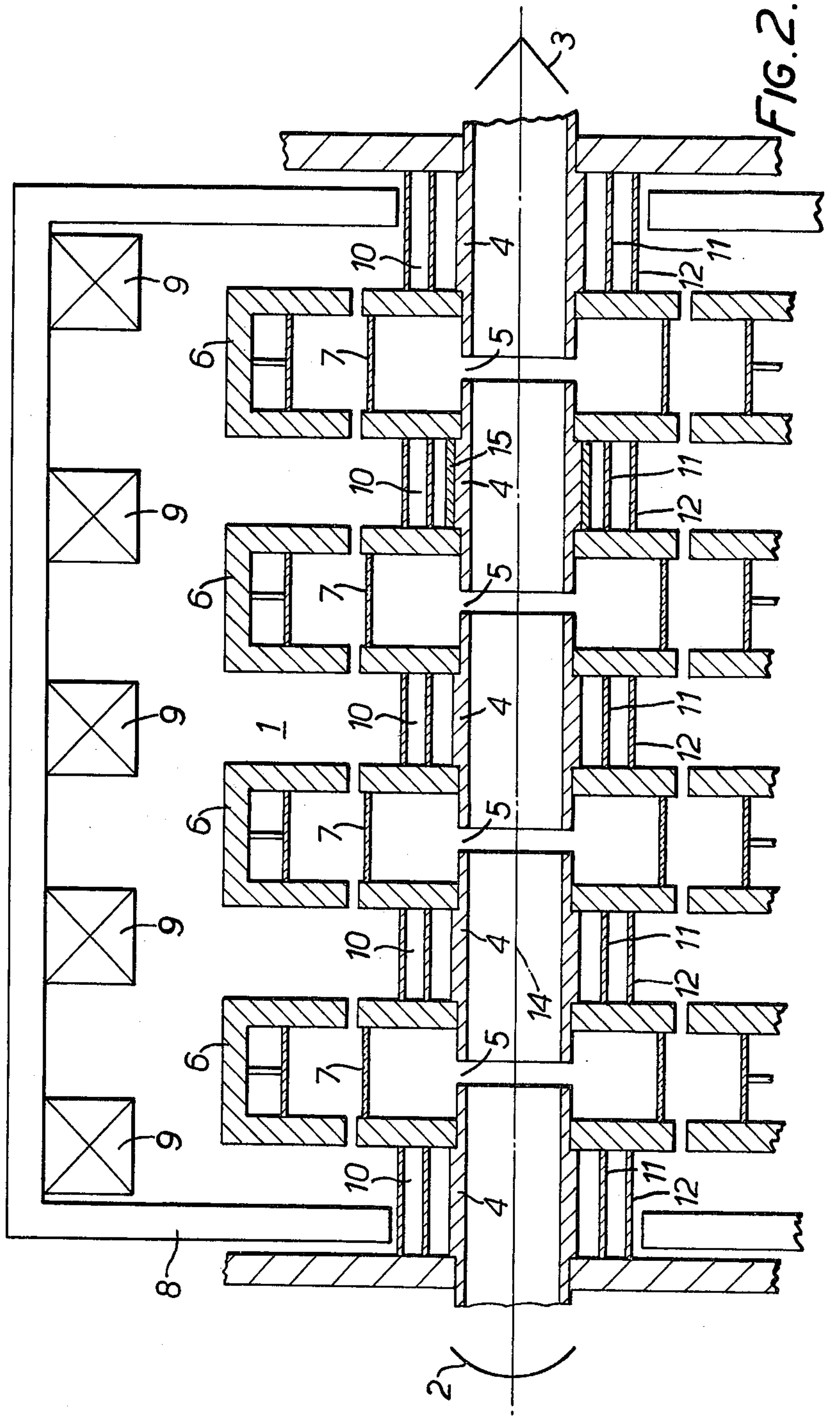

Referring to FIG. 2, in this case an iron cylindrical sleeve 15 is placed around the penultimate drift tube 4. As with the sleeve 13 of FIG. 1, sleeves similar to sleeve 15 may be provided around others of the drift tubes 4.

In another modification one or more of the drift tubes 4, is of, or is partly of, iron.

Figure 3:
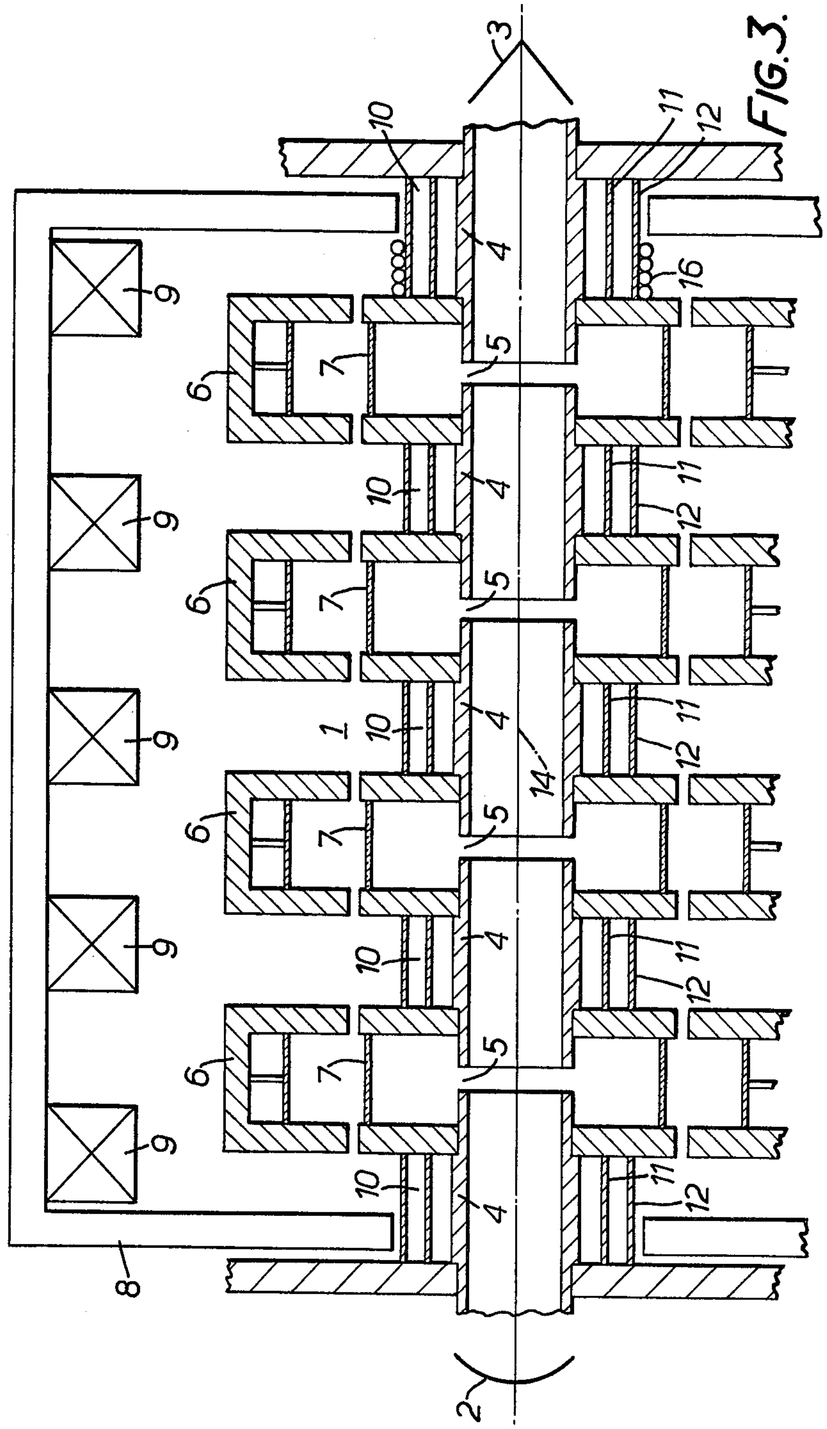

Referring to FIG. 3, in this example an auxiliary solenoid 16 replaces the iron cylindrical sleeve 13 of FIG. 1. The solenoid 16 is in this example, connected to be supplied in series with the main solenoids 9. In this example, the magnetic axis of solenoid 16 is aligned with the axis 14 of the interaction structure 1 and hence the radial component of magnetic field which is produced will be symmetrical with respect to this last-mentioned axis. Again auxiliary solenoids such as 16 may be provided around other ones of the water passages 10.

Figure 4:
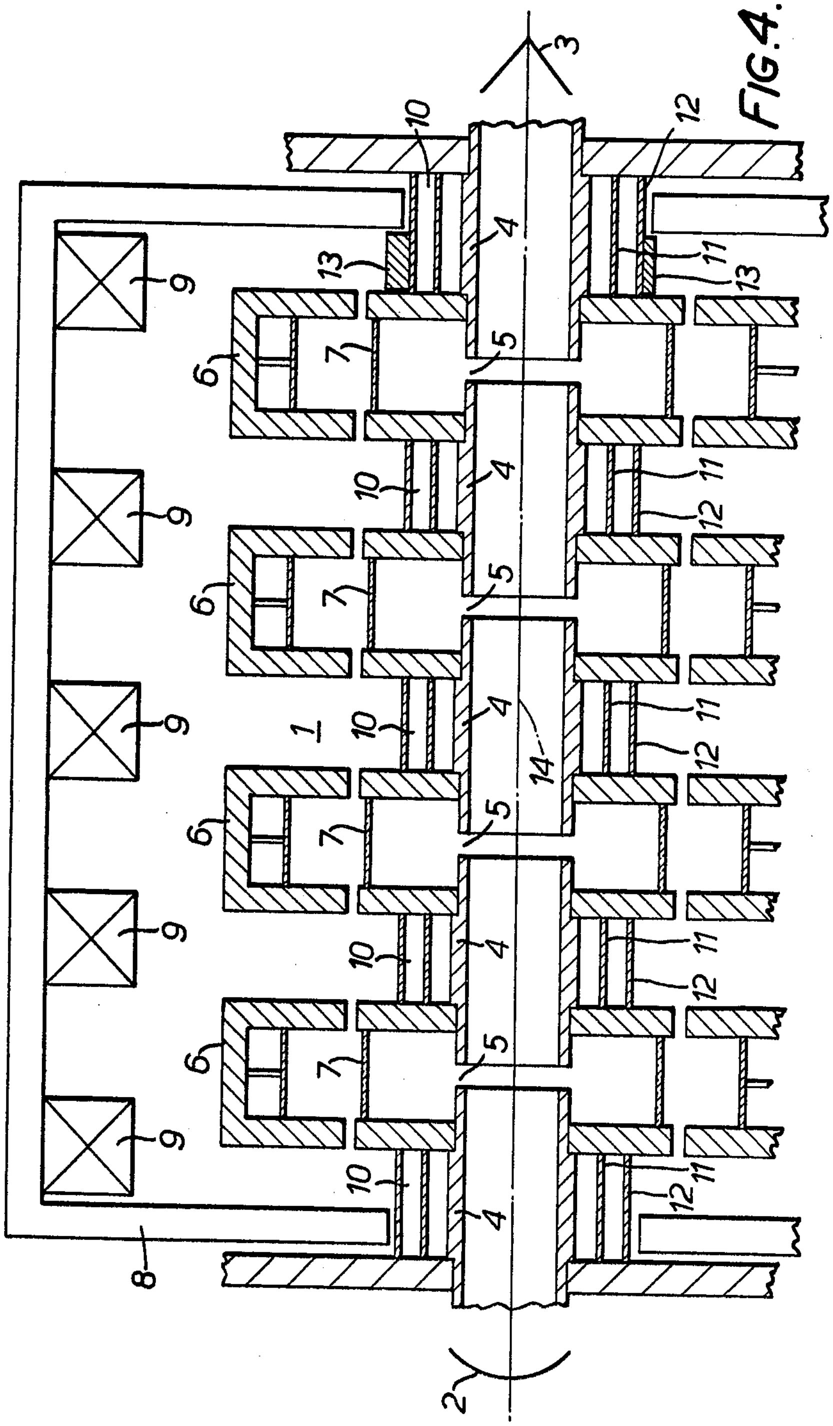

As will be appreciated the measures illustrated in FIGS. 1, 2 and 3 may be used in combination. In each case the example described is such as to result in a radial component of magnetic field which is symmetrical with respect to the axis 14 of the tube. If it is desired to achieve a radial component magnetic field which is asymmetrical with respect to the axis 14 of the tube there are a number of possibilities for achieving this effect. For example, in the arrangement illustrated in FIG. 1, iron sleeve 13 may be displaced laterally so that its axis does not co-incide with the axis 14 of the tube (conveniently the supporting outer jacket 12 may be similarly laterally displaced) or, as illustrated in FIG. 4, the iron sleeve 13 may be thicker on one side 13*a*, than it is on the other, 13*b*, or sleeve 13 may be only part cylindrical so as to extend only partly around the jacket 12.

Similarly in the embodiment illustrated in FIG. 2, sleeve 15 may be thicker on one side than it is on the other, or indeed be only part cylindrical so as to extend only partly around the drift tube 4.

In the embodiment illustrated in FIG. 3, the magnetic axis of the auxiliary solenoid may be displaced laterally so that it is not aligned with the axis 14.

I claim:

1. A klystron amplifier arrangement having at least one electro-magnetic solenoid operative to provide said klystron amplifier with a focussing magnetic field and including at least one electron gun and a collector electrode and wherein said arrangement is provided with means for producing a radial component of magnetic field operative to tend to direct relatively slowly moving beam electrons out of their path from the electron gun to the collector electrode while having an insubstantial effect upon the main focussing of the electron beam as provided by said solenoid.

2. An arrangement as claimed in claim 1 and wherein said means is such as to provide a radial component of magnetic field which is axially symmetrical.

3. An arrangement as claimed in claim 1 and wherein said means is such that said radial component of magnetic field is axially asymmetrical.

4. An arrangement as claimed in claim 1 and wherein the klystron amplifier is provided in operation with a focusing magnetic field produced by at least one solenoid said means comprises means for perturbing the magnetic field produced by said solenoid to produce said radial component of magnetic field.

5. An arrangement as claimed in claim 4 and wherein said means comprise quantity of magnetic material introduced into the field region of said solenoid.

6. An arrangement as claimed in claim 5 and wherein said magnetic material forms at least part of at least one cylinder surrounding the path of said beam.

7. A klystron amplifier arrangement having at least one electro-magnetic solenoid operative to provide said kylstron amplifier with a focussing magnetic field and including at least an electron gun, and a collector electrode and a plurality of cavities having interaction structure comprised of drift tubes and wherein means are provided for producing a radial component of magnetic field operative to tend to direct relatively slowly moving beam electrons out of their path from the electron gun to the collector electrode while having an insubstantial effect upon the main focussing of the electron beam as provided by said solenoid, said last mentioned means comprising magnetic material provided at least as part of at least one of the drift tubes of the interaction structure of at least one of said cavities.

8. A klystron amplifier arrangement having at least one electro-magnetic solenoid operative to provide said klystron amplifier with a focussing magnetic field and including at least an electron gun, a collector electrode and a plurality of cavities having interaction structures comprised of drift tubes and wherein means are provided for producing a radial component of magnetic field operative to tend to direct relatively slowly moving beam electrons out of their path from the electron gun to the collector electrode, while having an insubstantial effect upon the main focussing of the electron beam as provided by said solenoid, said last mentioned means comprising magnetic material provided at least as part of at least one of a number of water jackets provided for the purpose of cooling said drift tubes.

9. An arrangement as claimed in claim 8 and wherein wherever said magnetic material is in contact with cooling water during operation said material is treated so as to be corrosion resistant.

10. An arrangement as claimed in claim 9 and wherein said material is treated so as to be corrosion resistant by copper plating.

11. An arrangement as claimed in claim 4 and wherein magnetic material is incorporated within said solenoid.

12. An arrangement as claimed in claim 4 and wherein said means comprise an auxiliary solenoid.

13. An arrangement as claimed in claim 12 and wherein said auxiliary solenoid is arranged so that its axis is co-incident with that of said main solenoid whereby said radial component of magnetic field is axially symmetrical.

14. An arrangement as claimed in claim 12 and wherein said auxiliary solenoid is arranged to be supplied in series with said main solenoid.

15. An arrangement as claimed in claim 4 and wherein said means comprise a small number of turns of the main solenoid which are contra-wound.

16. A klystron amplifier arrangement having at least one electro-magnetic solenoid operative to provide said klystron amplifier with a focussing magnetic field and including at least one electron gun, a collector electrode and a plurality of cavities having interaction structures comprised of drift tubes and wherein means are provided for producing a radial component of magnetic field operative to tend to direct relatively slowly moving beam electrons out of their path from the electron gun to the collector electrode while having an insubstantial effect upon the main focussing of the electron beam as provided by said solenoid, said last mentioned means comprising an auxiliary solenoid wound around a water jacket provided for the purpose of cooling a drift tube.

17. An arrangement as claimed in claim 16 and wherein said last mentioned drift tube is immediately adjacent said collector electrode.

18. In a klystron amplifier of the type including an evacuated envelope containing a cathode and a collector electrode spaced therefrom to produce electron beam flow therebetween, magnetic means for focussing said electron beam, and interaction means disposed between said cathode and said collector electrode for velocity-modulating said electron beam whereby the electrons in the beam acquire a spread of velocities including very slow velocities which have a deleterious effect on the quality of the output of the amplifier, the improvement which comprises:

means adjacent said collector electrode for producing a radial component of magnetic field sufficient to deflect substantially only those electrons travelling at said very slow velocities to said interaction means whereby such deflected electrons do not reach said collector electrode.

19. In a klystron amplifier as defined in claim 18 wherein the means last mentioned perturbs the magnetic field produced by said magnetic focussing means.

20. In a klystron amplifier as defined in claim 19 wherein said means last mentioned comprises an iron sleeve surrounding said electron beam.

21. In a klystron amplifier as defined in claim 19 wherein said interaction means comprises a series of drift tubes and said means last mentioned comprises an iron sleeve surrounding one of said drift tubes adjacent said collector electrode.

22. In a klystron amplifier as defined in claim 19 wherein said interaction means comprises a series of drift tubes and said means last mentioned comprises at least a portion of one of said drift tubes adjacent said collector electrode which is formed of iron.

* * * * *